United States Patent
Tsai et al.

(10) Patent No.: US 9,621,171 B1
(45) Date of Patent: Apr. 11, 2017

(54) FREQUENCY SCALING METHOD, CIRCUIT AND ASSOCIATED ALL-DIGITAL PHASE-LOCKED LOOP

(71) Applicant: TAIWAN SEMICONDUCTOR MANUFACTURING COMPANY LTD., Hsinchu (TW)

(72) Inventors: Tsung-Hsien Tsai, Taoyuan County (TW); Chih-Hsien Chang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/871,602

(22) Filed: Sep. 30, 2015

(51) Int. Cl.
| | |
|---|---|
| H03L 7/095 | (2006.01) |
| H03L 7/099 | (2006.01) |
| H03L 7/10 | (2006.01) |
| H03K 7/06 | (2006.01) |
| H03L 7/091 | (2006.01) |
| H03L 7/093 | (2006.01) |

(52) U.S. Cl.
CPC ............... *H03L 7/10* (2013.01); *H03K 7/06* (2013.01); *H03L 7/091* (2013.01); *H03L 7/093* (2013.01); *H03L 7/095* (2013.01); *H03L 7/0994* (2013.01)

(58) Field of Classification Search
CPC ......... H03L 7/091; H03L 7/093; H03L 7/095; H03L 7/099; H03L 7/0991; H03L 7/0992; H03L 7/0994; H03L 7/10; H03L 7/101; H03L 7/104; H03L 7/105
USPC ........ 327/105, 106, 107, 113, 114, 115, 116, 327/117, 119, 150, 159
See application file for complete search history.

(56) References Cited

U.S. PATENT DOCUMENTS

| | | | |
|---|---|---|---|
| 2003/0107442 A1* | 6/2003 | Staszewski | H03L 7/085 331/1 A |
| 2013/0222026 A1* | 8/2013 | Havens | H03L 7/0995 327/158 |
| 2016/0099720 A1* | 4/2016 | Bashir | H03B 5/1215 331/8 |

* cited by examiner

*Primary Examiner* — William Hernandez
(74) *Attorney, Agent, or Firm* — WPAT, P.C., Intellectual Property Attorneys; Anthony King (57) ABSTRACT

A frequency scaling method is disclosed. The method is used for changing an output frequency of an all-digital phase-locked loop (ADPLL) from a first frequency to a second frequency different from the first frequency. The method includes: stopping a feeding of a first oscillator tuning word (OTW) to a digitally controlled oscillator (DCO) of the ADPLL, wherein the first OTW is generated based on a phase detecting result obtained with respect to the first frequency; feeding a second OTW to the DCO in order to change the output frequency from the first frequency to the second frequency; and performing a zero phase restart (ZPR) operation to produce the phase detecting result according to the second frequency. An associated ADPLL and a frequency scaling circuit are also disclosed.

20 Claims, 6 Drawing Sheets

FIG. 6

FREQUENCY SCALING METHOD, CIRCUIT AND ASSOCIATED ALL-DIGITAL PHASE-LOCKED LOOP

BACKGROUND

In modern digital radio design, an RF frequency synthesizer is a key block used for both up-conversion and down-conversion of radio signals. Traditionally, it has been based on a charge-pump PLL which is not easily amenable to scaled CMOS integration and suffers from a high level of reference spurs generated by the correlative phase detection method. Use of a digitally-controlled oscillator (DCO) that deliberately avoids any analog tuning controls has been proposed and demonstrated for RF wireless applications. This allows for the loop control circuitry to be implemented in a fully digital manner as a digital-synchronous phase-domain all-digital PLL (ADPLL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Frequency scaling is generally adopted in various systems, such as an Internet of Things (IoT) device or a Serializer-Deserializer (SerDes), for different applications. One of the applications is associated with power management. A device embedded with the function of frequency scaling can switch its operating frequency from a high frequency to a low frequency, or vice versa, by configuring a frequency synthesizer therein. In an application of IoT power management, an IoT device has to be activated from a power saving mode or a sleep mode to a normal mode in a specified limited time period in order to reduce waiting time and improve user experience. In fact, other applications also demands fast reaction of frequency scaling for similar reasons.

A locking time of a phase locked loop (PLL) is a bottleneck when realizing said fast frequency scaling function when a target frequency of the PLL is controlled to operationally change from one frequency to another. Generally, a locking time of an existing analog PLL is larger than about 2500 reference clock cycles. However, in some existing approaches, the locking time can be further reduced to about 250 reference clock cycles from the original 2500 reference clock cycles by means of setting different loop bandwidths for different locking stages. For example, a large loop bandwidth is employed for an initial locking stage, also known as a frequency tracking stage or a coarse tune stage; and then the locking stage moves to a stable locking stage by switching from the large loop bandwidth to a small loop bandwidth. The stable locking stage is also called a phase tracking stage or a fine tune stage. The mechanism of switching between the large and small loop bandwidths is complicated and the improvement is somewhat limited.

The locking time of an existing all-digital PLL (ADPLL) is much shorter than that of an analog PLL. Some prior art ADPLLs have a reduced locking time of about 100 reference clock cycles. However, such a performance still cannot meet the fast frequency scaling requirement specified in some modern standards. One feature of the present disclosure is to provide an ADPLL architecture having a fast frequency scaling ability so that the disclosed ADPLL architecture can go into a locking stage faster than existing approaches. The proposed ADPLL architecture has a reduced locking time of about 10 reference clock cycles compared with about 100 reference clock cycles of prior art ADPLLs and about 2500 reference clock cycles of prior art analog PLLs.

A concept of the present disclosure includes directly injecting an oscillator tuning word (OTW) into a digitally controlled oscillator (DCO) of a time-to-digital converter (TDC) based ADPLL. Detailed operations and mechanisms will be given as follows.

Schematic View for ADPLL Architecture

Figure 1:
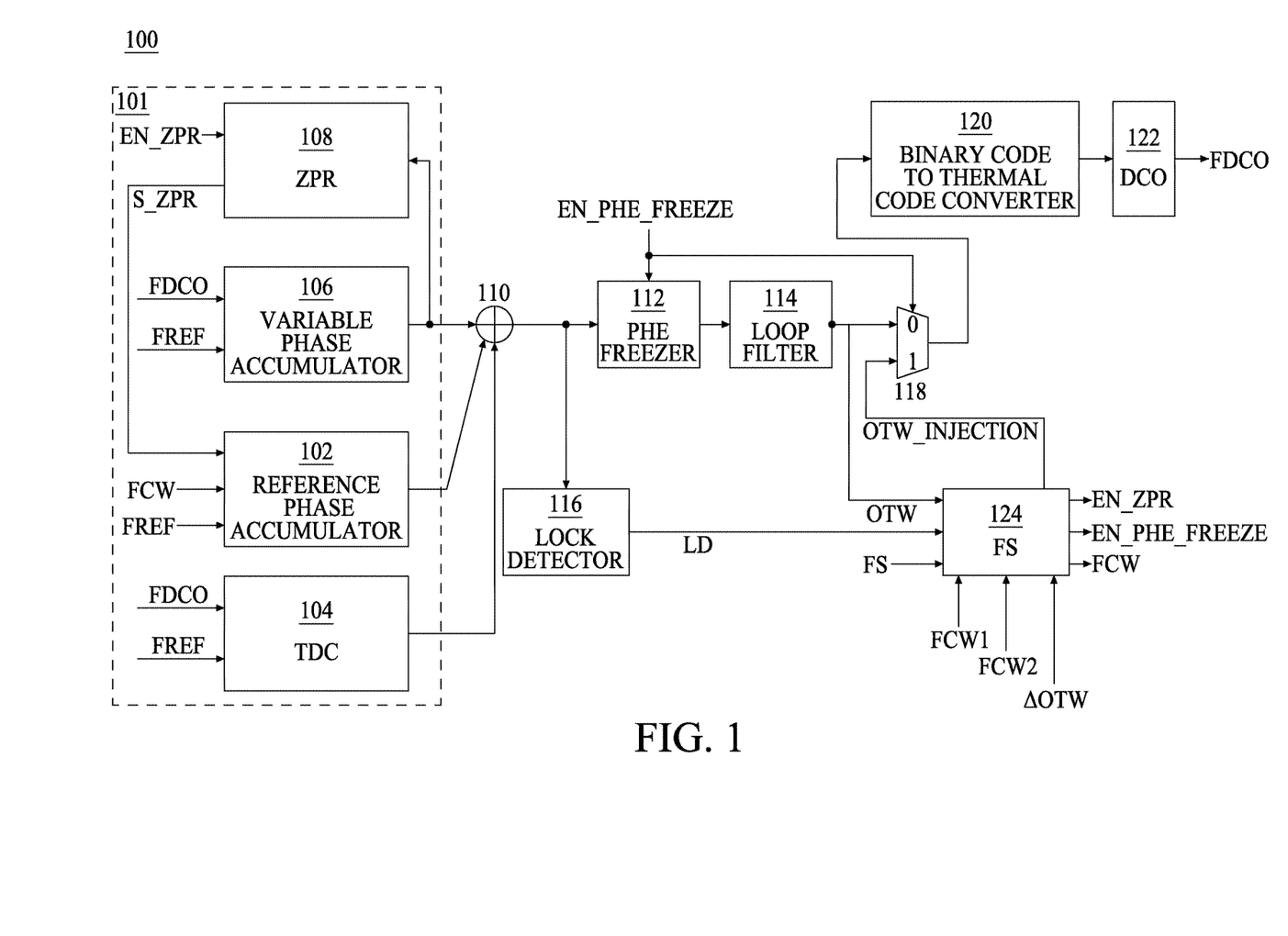
FIG. 1 is a schematic view illustrating an ADPLL incorporating a frequency scaling mechanism according to an embodiment of the present disclosure.

A schematic view illustrating an ADPLL incorporating a frequency scaling mechanism is shown in FIG. 1 according to an exemplary embodiment of the present disclosure. Please note that it is not intended for the invention to be limited to the examples shown herein. One skilled in the art can apply the principles of the present invention to other control applications as well without departing from the scope of the invention.

With reference to FIG. 1, the ADPLL 100 includes a phase counter 101 accumulating a frequency command word (FCW) and a phase of a DCO clock FDCO. The phase counter 101 detects a phase difference between a reference clock FREF and the DCO clock FDCO. A phase detector 110 compensates for a phase difference between the FCW and the DCO clock FDCO according to the phase difference between the reference clock FREF and the DCO clock FDCO. In this way, a digital phase error value can be fixed in real time so as to achieve a phase locked state. A digital loop filter 114 filters the digital phase error value and controlling PLL operational characteristics. A lock detector 116 detects whether an output from the phase detector 110 meets a specified condition and generates a lock indication signal LD. A DCO 122 controls the frequency of the DCO clock FDCO according to an output from the digital loop filter 114 or a frequency scaling circuit 124. In this embodiment, a binary code output from the digital loop filter 114 or the frequency scaling circuit 124 is converted into a thermal code by a binary code to thermal code converter 120 before being fed into the DCO 122 in order to improve a hardware cost and/or performance of the DCO 122. However, this is not a limitation of the present disclosure. In some embodiments, the binary code to thermal code converter 120 may be omitted. In some embodiments, the DCO 122 may require other types of DCO control codes.

The phase counter 101 of FIG. 1 includes a reference phase accumulator 102, a variable phase accumulator 106, a TDC 104 and a zero phase restart (ZPR) circuit 108. The reference phase accumulator 102 accumulates the phase of the FCW according to the reference clock FREF. The variable phase accumulator 106 accumulates the phase of the DCO clock FDCO and samples an accumulating result according to the reference clock FREF so as to detect a variation of the DCO clock FDCO. The TDC 104 detects a phase difference between the reference clock FREF and the DCO clock FDCO. In addition, the ZPR circuit 108 is deployed to receive a signal EN_ZPR to enable the phase counter 101 to enter a ZPR operation for a specified time period whenever the ADPLL 100 is re-activated or when the ADPLL 100 is configured to perform a frequency scaling operation.

The mechanism of the fast frequency scaling of the present disclosure is achieved by employing several functional blocks at least including the frequency scaling circuit 124, a phase error (PHE) freezer 112 and an OTW selector 118. The frequency scaling circuit 124 is used to generate control signals regarding OTW injection and other supporting signals to adjust operations of the ADPLL 100, so as to allow for a smooth and correct frequency switching while switching the DCO 122 between different frequency modes. The OTW selector 118 and the PHE freezer 112 are utilized as auxiliary circuits in conjunction with the frequency scaling circuit 124. The OTW selector 118 can be implemented as a multiplexer having two inputs coming from the digital loop filter 114 and the frequency scaling circuit 124 respectively. The OTW selector 118 in operation selectively feeds one of its inputs to the binary code to thermal code converter 120 based on a signal EN_PHE_FREEZE at its select line. The PHE freezer 112 is used to operationally open or close the loop of the ADPLL 100 based on a control signal EN_PHE_FREEZE produced by the frequency scaling circuit 124. In this embodiment, the PHE freezer 112 is coupled between the phase detector 110 and the digital loop filter 114. Please note that it is not intended for the invention to be limited to the examples shown herein. One skilled in the art can apply the principles of the present invention to other control applications as well without departing from the scope of the invention. For example, the PHE freezer 112 may be disposed between the digital loop filter 114 and the OTW selector 118.

In this embodiment, the frequency scaling circuit 124 controls the ADPLL 100 to switch between a 3 GHz frequency band and a 2 GHz frequency band. The 3 GHz frequency band is provided when a system, to which the ADPLL 100 is applied, operates in a normal mode. In contrast, the 2 GHz frequency band is provided when the system operates in a power saving mode. The present disclosure may be further applied to systems that possess more than 2 modes, i.e., requiring more than two different clock frequencies. One skilled in the art can apply the principles of the present invention to other control applications as well without departing from the scope of the invention.

Circuit for Frequency Scaling Circuit Architecture

Figure 2:
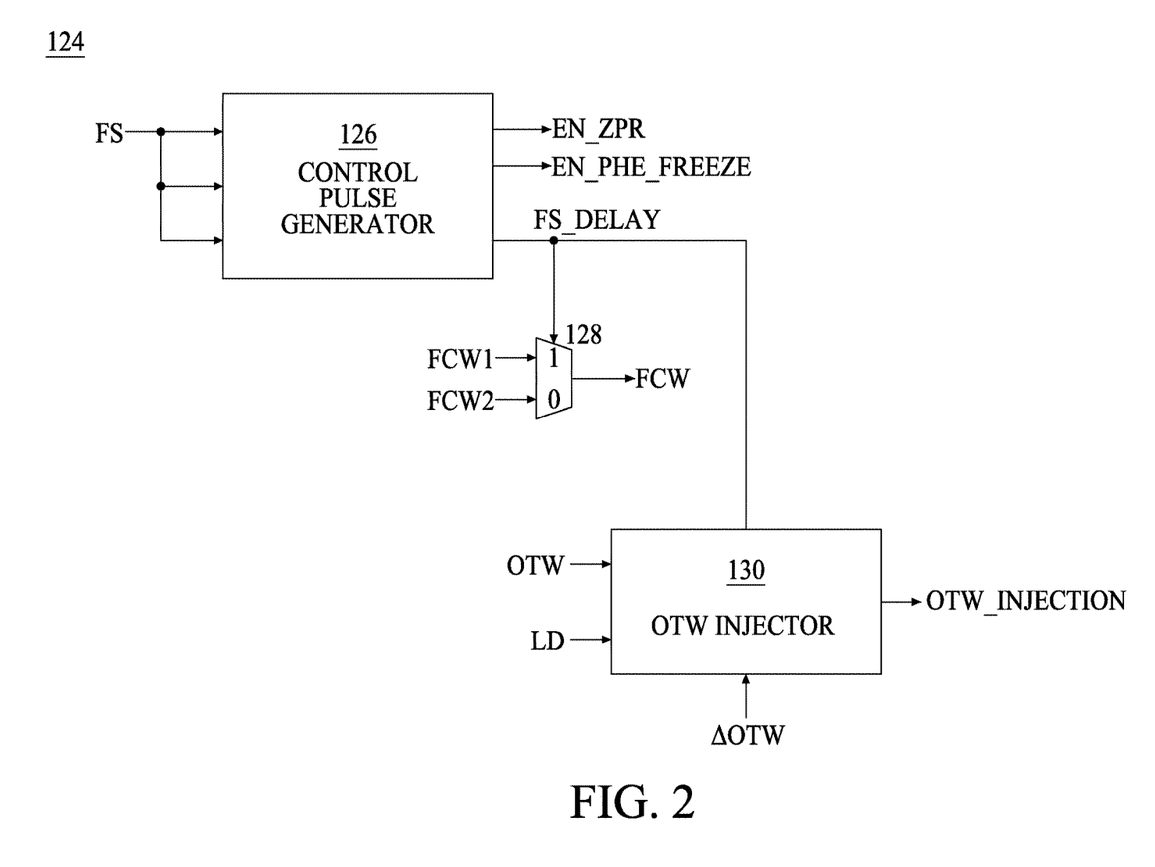
FIG. 2 is a schematic view illustrating a frequency scaling circuit according to an embodiment of the present disclosure.

FIG. 2 is a schematic view illustrating the frequency scaling circuit 124 according to an embodiment of the present disclosure. The frequency scaling circuit 124 includes a control pulse generator 126, a 2-input multiplexer 128 and an OTW injector 130. As mentioned above, the signal EN_ZPR is used to enable the phase counter 101 to enter into the ZPR operation mode, and the loop freezing signal EN_PHE_FREEZE is used to open or close the loop of the ADPLL 100. The control pulse generator 126 further generates a signal FS_DELAY, which is produced by delaying the signal FS for a time period. Both of the signals EN_ZPR and EN_PHE_FREEZE are generated by the control pulse generator 126 based on the signal FS coming from an external circuit. In some embodiments, the external circuit may be integrated with the ADPLL 100 on a single die or a single chip. In some other embodiments, the external circuit may be disposed in another chip and communicate with the ADPLL 100 through wires on a printed circuit board (PCB).

When a user or a system intends to control the ADPLL 100 to conduct frequency scaling, the user or the system can change a logic level of the signal FS. For example, the user or the system can assert the signal FS from a logical low level to a logical high level; or the user or the system can deassert the signal FS from a logical high level to a logical low level. Specifically, when the user or the system intends to slow down an operating frequency, the user or the system can assert the signal FS to decelerate the DCO 122 of the ADPLL 100 and obtain the DCO clock FDCO with the 2 GHz frequency. Alternatively, when the user or the system requires a higher operating frequency, the user or the system can accelerate the ADPLL 100 by de-asserting the signal FS and obtaining the DCO clock FDCO with the 3 GHz frequency.

Figure 3:
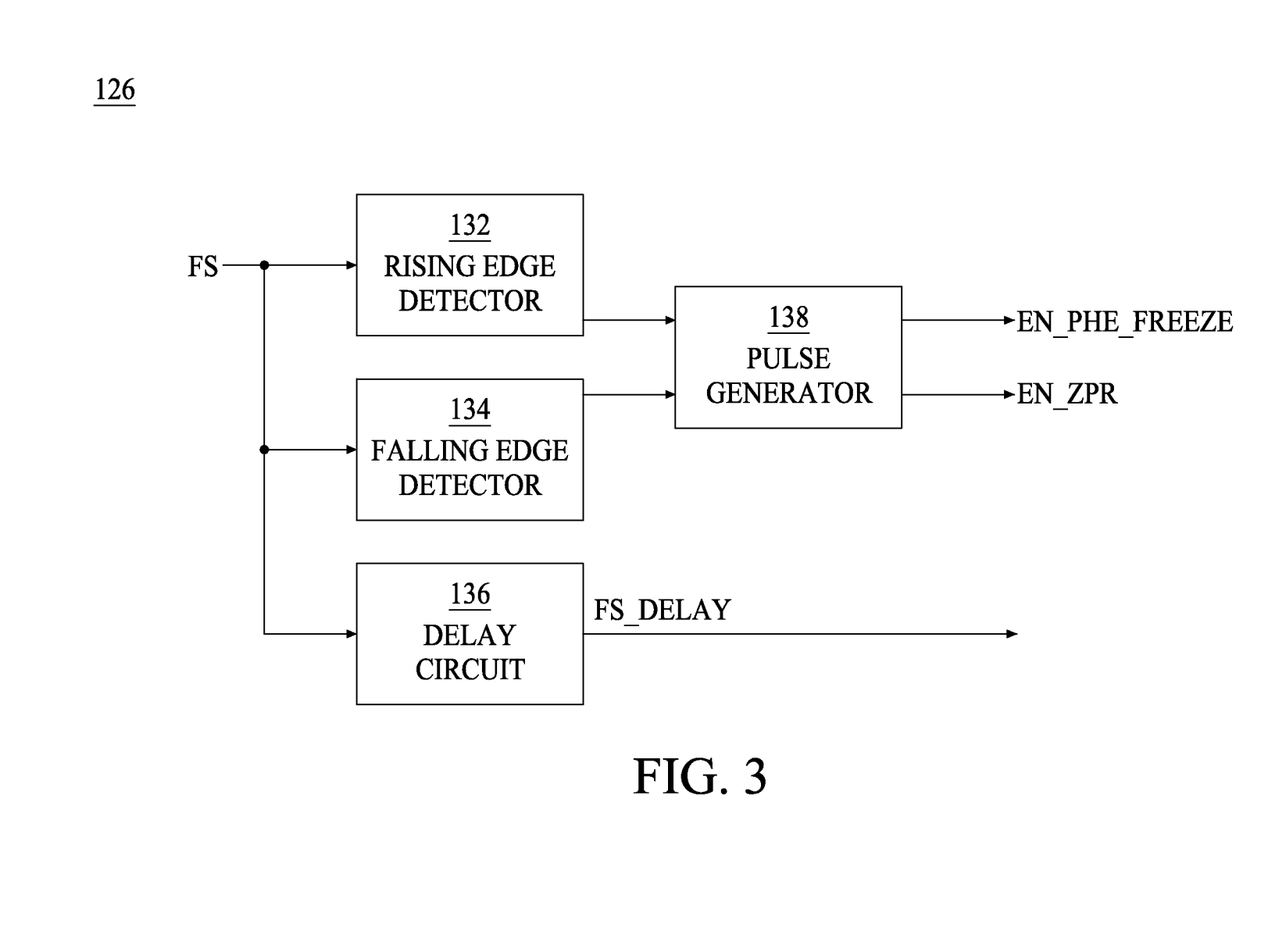
FIG. 3 is a schematic view illustrating a control pulse generator according to an embodiment of the present disclosure.
Figure 5:
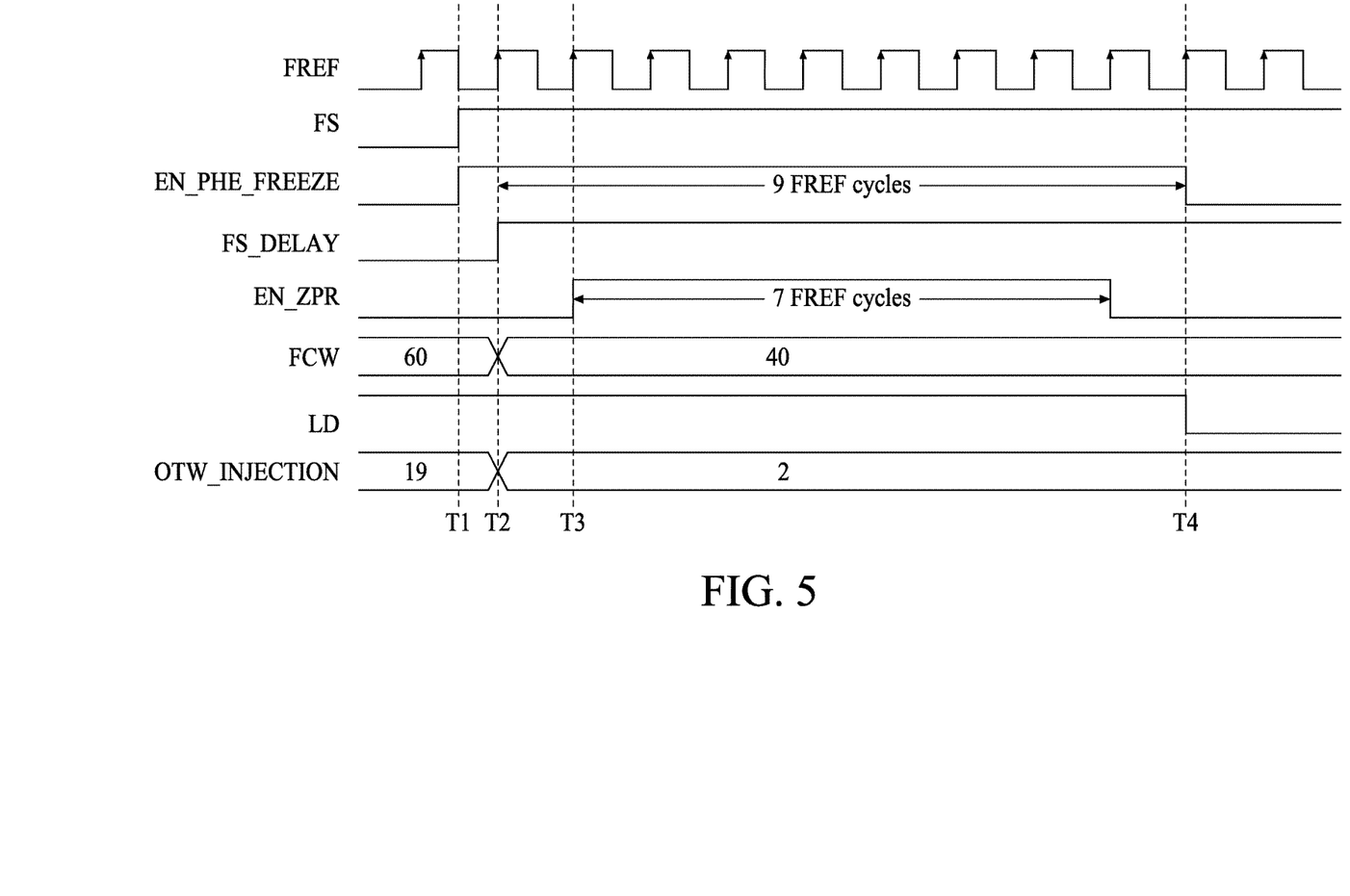
FIG. 5 is a timing diagram illustrating logical levels of signals related to the frequency scaling circuit.

In order to more specifically define the control pulse generator 126, please refer to FIG. 3 and FIG. 5 in conjunction with FIG. 2. FIG. 3 is a schematic view illustrating the control pulse generator 126. FIG. 5 is a timing diagram illustrating logical levels of signals related to the frequency scaling circuit 124. The control pulse generator 126 includes a rising edge detector 132, a falling edge detector 134, a delay circuit 136 and a pulse generator 138. The rising edge detector 132 is used to monitor a situation that the logical level of the signal FS changes from low to high, and to produce a sensing result in response to such a situation. The sensing result is fed to the subsequent circuit, i.e., the pulse generator 138, to produce the signals EN_PHE_FREEZE and EN_ZPR both having a desired format. As shown in FIG. 5, rising edges of the signal EN_PHE_FREEZE and the signal FS appear substantially at the same time (time point T1). In this way, the ADPLL 100 can be configured to become an open loop from a closed loop at the initial stage of the frequency scaling operation. The ADPLL 100 being forced to become the open loop at substantially the same time that the signal FS is asserted allows an avoidance of a feedback of signals that are not settled down yet from the circuits upstream the PHE freezer 112.

As shown in FIG. 5, the signal EN_ZPR is asserted at the second rising edge (time point T3) of the reference clock FREF following the rising edge of the signal FS (time point T1). Please note that the reference clock FREF is not depicted in FIGS. 2 and 4 for conciseness.

The falling edge detector 134 is used to monitor a situation in which the logical level of the signal FS changes from high to low, and to produce a sensing result in response to such a situation. The sensing result is fed to the subsequent circuit, i.e. the pulse generator 138 in order to produce the signals EN_PHE_FREEZE and EN_ZPR with the desired format. The principle of the falling edge detector 134 is basically similar to the rising edge detector 132. A rising edge of the signal EN_PHE_FREEZE and a rising edge of the signal FS appear substantially at the same time. The signal EN_ZPR is asserted at the second rising edge of the reference clock FREF following the rising edge of the signal FS.

Each time the frequency scaling of the ADPLL 100 is activated by the signal FS, the signals EN_PHE_FREEZE and EN_ZPR are asserted as described above. The assertion of the signals EN_PHE_FREEZE and EN_ZPR remains for a specified time period in order to ensure that the entire ADPLL circuit 100 is appropriately configured for frequency scaling. Specifically, as can be seen in FIG. 5, the signal EN_PHE_FREEZE is deasserted after nine clock cycles of the reference clock FREF following a time point T2. The signal EN_ZPR is deasserted after 7 clock cycles of the reference clock FREF following the time point T3.

The delay circuit 136 is used to produce the signal FS_DELAY based on the signal FS. As depicted in FIG. 5, the signal FS_DELAY is asserted at the time point T2. Referring back to FIG. 2, the signal FS_DELAY is coupled to the select line of the 2-input multiplexer 128 and the OTW injector 130. The 2-input multiplexer 128 outputs a first frequency command word (FCW) value or a second FCW value as the signal FCW in accordance with the signal FS_DELAY. The first FCW value and the second FCW value are predetermined parameters defined according to the desired frequency bands at which the ADPLL 100 operates. In this embodiment, the first FCW value, 60, is derived from the target frequency 3 GHz; and the second FCW value, 40 is derived from the target frequency 2 GHz. As such, when the ADPLL 100 is configured to operate at 3 GHz, the FCW value injected into the reference phase accumulator 102 is 60; when the ADPLL 100 is configured to operate at 2 GHz, the FCW value injected into the reference phase accumulator 102 is 40. Please note that it is not intended for the invention to be limited to the examples shown herein. One skilled in the art can apply the principles of the present invention to other control applications as well without departing from the scope of the invention.

Figure 4:
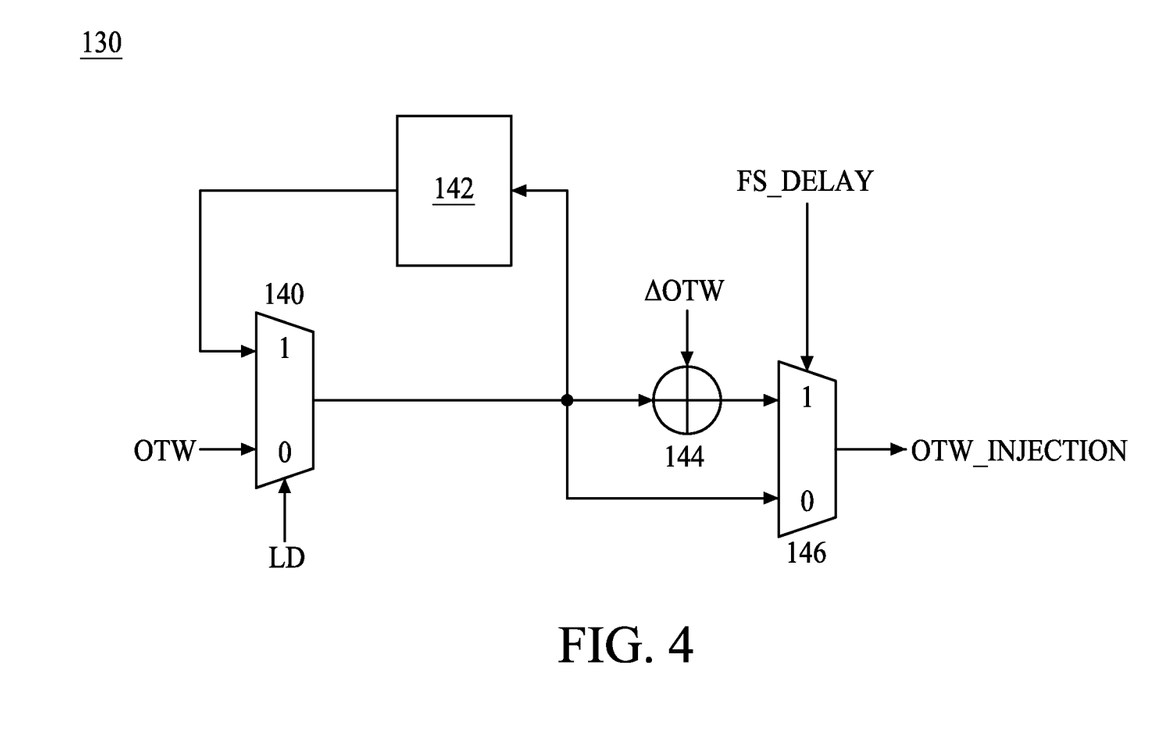
FIG. 4 is a schematic view illustrating an oscillator tuning word (OTW) injector according to an embodiment of the present disclosure.

Also referring to FIG. 2, the OTW injector 130 produces a signal OTW_INJECTION at least according to signals OTW, LD, ΔOTW and FS_DELAY. A more specific schematic view of the OTW injector 130 is depicted in FIG. 4 according to an embodiment of the present disclosure. Referring to FIG. 4, the OTW injector 130 includes 2-input multiplexers 140 and 146, a register 142 and an OTW adder 144. The 2-input multiplexers 140 are used to select the output signal OTW of the digital loop filter 114 or an output signal of the register 142 according to the lock indication signal LD. The lock indication signal LD is produced by the lock detector 116. As the name suggests, the lock detector 116 is utilized to evaluate a lock quality of the entire ADPLL 100. In this embodiment, the lock detector 116 keeps monitoring if the digital phase error value obtained by the phase detector 110 exceeds a specified threshold value, for instance. When the digital phase error value of the phase detector 110 is continuously lower than the threshold value for a predetermined time period, e.g., 128 clock cycles of the reference clock FREF, the lock indication signal LD is asserted. Once the digital phase error value of the phase detector 110 exceeds the specified threshold value, the lock indication signal LD is deasserted.

During the frequency scaling operation, the lock indication signal LD is forced to be asserted. To put it more specifically, the lock indication signal LD is fixed to the logical high level whenever the signal EN_PHE_FREEZE is asserted, as can be seen in FIG. 5. Referring back to FIG. 4, the register 142 records the latest output of the 2-input multiplexer 140. When the lock indication signal LD is at the logical high level, a value stored in the register 142 is the OTW value input to the 2-input multiplexer 140 right before the lock indication signal LD asserts. The signal ΔOTW is predefined according to frequencies of the DCO 122 before and after the frequency scaling operation. The OTW value stored in the register 142 and signal ΔOTW are summed up to produces the signal OTW_INJECTION when the signal FS_DELAY is asserted. In this exemplary embodiment, the OTW value stored in the register 142 is 19 when the lock indication signal LD is at the logical high level as shown in FIG. 5. As such, a value of the signal OTW_INJECTION is also 19 before the signal FS_DELAY is asserted. When the signal FS_DELAY is asserted, the value of the signal OTW_INJECTION is switched to a summation of the OTW value and the received signal ΔOTW. In this embodiment, the received signal ΔOTW is a negative value (i.e. −17) in order to adjust oscillating frequency of the DCO 122 from 3 GHz to 2 GHz, and the summation of the OTW value and the received signal ΔOTW is 2.

Please note that the signals OTW, OTW_INJECTION are utilized to adjust the DCO 122, and the meaning is similar to using a variable voltage signal to adjust an output voltage of an analog voltage controlled oscillator (VCO). In the present disclosure, the signal ΔOTW represents how much a user wants to rescale the frequency of the DCO 122, and includes information of rescale direction (i.e. acceleration or deceleration). During the frequency scaling operation, the signal OTW_INJECTION is injected into the DCO 122. To put it more specifically, the signal OTW_INJECTION is transmitted to the binary code to thermal code converter 120 through the 2-input multiplexer 118. The binary code to thermal code converter 120 converts the signal OTW_INJECTION in binary into a thermal code, and then feeds the signal OTW_INJECTION in thermal code to the DCO 122.

Operation for Frequency Scaling Operation

Figure 6:
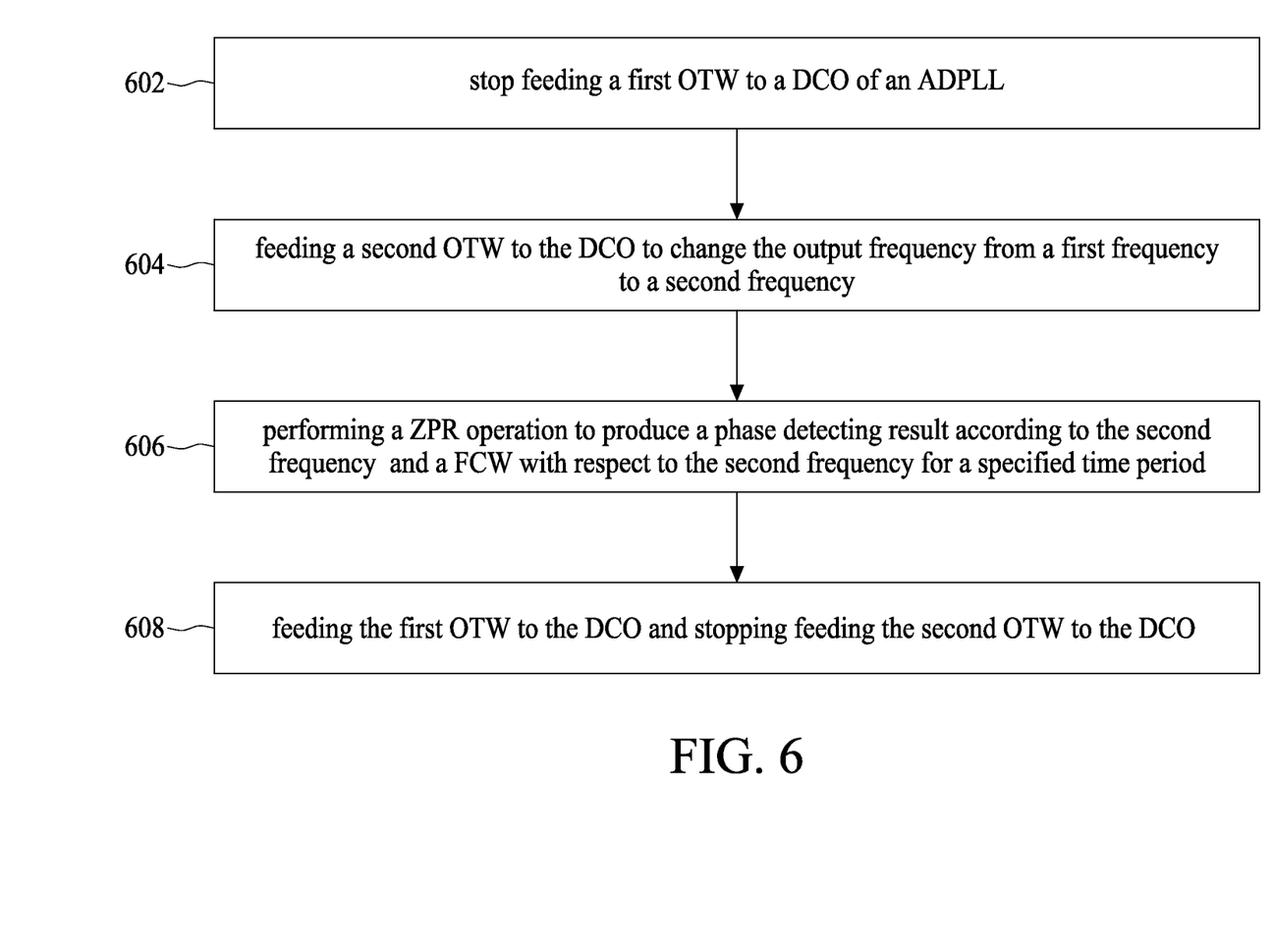
FIG. 6 is a flow diagram illustrating a frequency scaling operation according to an embodiment of the present disclosure.

Once receiving the signal OTW_INJECTION, the DCO 122 jumps to a target frequency in response to the signal OTW_INJECTION. For example, the DCO 122 adjusts its oscillating frequency from 3 GHz to 2 GHz. The DCO clock FDCO, of course, reflects the frequency change of the DCO 122, and affects the phase counter 101 because the DCO clock FDCO is coupled to the variable phase accumulator 106 and the TDC 104 as shown in FIG. 1. At an initial stage of the frequency scaling, the phase counter 101 adapts itself to the current target frequency based on the DCO clock FDCO. FIG. 6 is a flow diagram illustrating a frequency scaling operation according to an embodiment of the present disclosure. More detailed descriptions for each stage of the frequency scaling are provided in the following paragraphs.

In order to facilitate the understanding of the disclosed frequency scaling mechanism, FIG. 6 is described herein in connection with embodiments shown in FIGS. 1-5. Please note that it is not intended for the invention to be limited to the specific form set forth herein. Rather, the scope of the present disclosure is limited only by the accompanying claims. When the control signal FS indicates a frequency scaling operation is requested, the flow starts and enters into operation 602. In operation 602, feeding of the first OTW to the DCO 122 is stopped. In the embodiment shown in FIG. 1, the first OTW is disconnected from the DCO 122 by the PHE freezer 112 based on a control signal EN_PHE_FREEZE. However, other implementations that can achieve substantially the same objective also fall within the scope of the present disclosure. The first OTW (i.e. the signal OTW of FIG. 1) is generated based on the phase detecting result of the phase counter 101 and the phase detector 110 with respect to the first frequency, i.e., 3 GHz in this embodiment as mentioned above.

In operation 604, the second OTW is fed to the DCO 122 to change the output frequency from the first frequency to the second frequency, i.e., from 3 GHz to 2 GHz according to this embodiment. Specifically, the second OTW (i.e. the signal OTW_INJECTION of FIG. 1) is derived based on the first OTW and an OTW difference (i.e. the signal ΔOTW of FIG. 1). In this stage, the DCO 122 works in response to the second OTW instead of the first OTW. In other words, when the ADPLL 100 does not perform the frequency scaling operation, for example, the ADPLL 100 operates in a normal mode, the DCO 122 of the ADPLL 100 receives the first OTW. When the ADPLL 100 performs the frequency scaling operation in order to change the frequency of the DCO clock FDCO, the DCO 122 of the ADPLL 100 receives the second OTW.

In operation 606, the ZPR circuit 108 in the phase counter 101 is activated by the FS circuit 124, so that the phase counter 101 can perform the ZPR operation by employing the second frequency command word FCW of the second frequency for the specified time period. For example, 7 clock cycles of the reference clock FREF. When the ZPR operation is performed for the specified time period, the first OTW is ready for reconnecting to the DCO 122 without causing instability to the entire ADPLL 100. Thus, in operation 608, the first OTW is fed to the DCO 122 again and the second OTW is disconnected from the DCO 122 at the same time.

The present frequency scaling operation greatly reduces the processing cycles of prior art frequency scaling methods. As can be seen in FIG. 5, the frequency scaling operation starts at time point T1 and ends at time point T4, which is less than 10 clock cycles of the reference clock FREF. In some embodiments, the specified time for the ZPR operation may be further reduced under the premise of not causing instability. In this way, the entire operation time of the present frequency scaling operation may be further reduced.

Some embodiments of the present disclosure provide a frequency scaling method for changing an output frequency of an all-digital phase-locked loop (ADPLL) from a first frequency to a second frequency different from the first frequency. The method includes: stopping a feeding of a first oscillator tuning word (OTW) to a digitally controlled oscillator (DCO) of the ADPLL, wherein the first OTW is generated based on a phase detecting result obtained with respect to the first frequency; feeding a second OTW to the DCO in order to change the output frequency from the first frequency to the second frequency; and performing a zero phase restart (ZPR) operation to produce the phase detecting result according to the second frequency.

In some embodiments of the present disclosure, the ADPLL is a time-to-digital converter (TDC) based ADPLL.

In some embodiments of the present disclosure, the performing of the ZPR operation to produce the phase detecting result according to the second frequency includes: performing the ZPR operation to produce the phase detecting result according to the second frequency and a frequency command word (FCW) with respect to the second frequency.

In some embodiments of the present disclosure, the performing of the ZPR operation to produce the phase detecting result according to the second frequency includes: performing the ZPR operation to produce the phase detecting result according to the second frequency for a specified time period.

In some embodiments of the present disclosure, the method further includes: when the ZPR operation is performed for a specified time period, feeding the first OTW to the DCO and stopping the feeding of the second OTW to the DCO.

In some embodiments of the present disclosure, the method further includes: obtaining the second OTW based on the first OTW and an OTW difference.

In some embodiments of the present disclosure, the OTW difference is obtained based on a frequency difference between the first frequency and the second frequency.

Some embodiments of the present disclosure provide an all-digital phase-locked loop (ADPLL). The ADPLL includes a phase detecting circuit, a DCO and a frequency scaling circuit. The phase detecting circuit is configured to detect a phase difference between an output frequency of a digitally controlled oscillator (DCO) and a reference frequency, and generate a phase detecting result based on the detected phase difference. The DCO is coupled to the phase detecting circuit, and the DCO being configured to generate the output frequency responsive to the phase detecting result. The frequency scaling circuit is coupled to the phase detecting circuit and the DCO, and the frequency scaling circuit being configured to selectively feed a first oscillator tuning word (OTW) generated based on the phase detecting result or a second OTW to the DCO, so as to change the output frequency of the DCO from a first frequency to a second frequency.

In some embodiments of the present disclosure, the phase detecting circuit includes a zero phase restart (ZPR) circuit, and the phase detecting circuit is configured to perform a ZPR.

In some embodiments of the present disclosure, the ZPR operation is performed responsive to a control of the frequency scaling circuit.

In some embodiments of the present disclosure, the ADPLL further includes a loop filter coupled between the phase detecting circuit and the DCO.

In some embodiments of the present disclosure, the ADPLL further includes a binary code to thermal code converter coupled between the loop filter and the DCO.

In some embodiments of the present disclosure, the ADPLL further includes a lock detector coupled between the phase detecting circuit and the frequency scaling circuit.

In some embodiments of the present disclosure, the phase detecting circuit further includes a time-to-digital converter (TDC), a reference phase accumulator and a variable phase accumulator. The TDC is configured to detect a phase difference between the reference frequency and the output frequency of the DCO. The reference phase accumulator is configured to accumulate a phase of a frequency command word (FCW). The variable phase accumulator is configured to accumulate a phase of the output frequency of the DCO.

In some embodiments of the present disclosure, when the frequency scaling circuit is requested to perform a frequency scaling operation, the frequency scaling circuit feeds the second OTW to the DCO.

In some embodiments of the present disclosure, when the frequency scaling circuit is requested to perform a frequency scaling operation, the frequency scaling circuit activates the ZPR operation for a specified time period.

In some embodiments of the present disclosure, the frequency scaling circuit comprises an OTW injector, wherein the OTW injector is configured to generate the second OTW based on the first OTW and an OTW difference, and the OTW difference is obtained based on a frequency difference between the first frequency and the second frequency.

Some embodiments of the present disclosure provide a frequency scaling circuit for controlling a phase detecting circuit and a digitally controlled oscillator (DCO) to change an output frequency from a first frequency to a second frequency. The frequency scaling circuit includes a control pulse generator and an OTW injector. The control pulse generator is configured to selectively feed a first oscillator tuning word (OTW) generated based on a phase detecting result by the phase detecting circuit or a second OTW to the DCO. The OTW injector is configured to generate the second OTW.

In some embodiments of the present disclosure, the control pulse generator further controls activation of a zero phase restart (ZPR) operation of the phase detecting circuit.

In some embodiments of the present disclosure, the OTW injector generates the second OTW based on the first OTW and an OTW difference, and the OTW difference is obtained based on a frequency difference between the first frequency and the second frequency.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A frequency scaling method for changing an output frequency of an all-digital phase-locked loop (ADPLL) from a first frequency to a second frequency different from the first frequency, the method comprising:
    stopping feeding a first oscillator tuning word (OTW) to a digitally controlled oscillator (DCO) of the ADPLL, wherein the first OTW is generated based on a phase detecting result obtained with respect to the first frequency;
    feeding a second OTW to the DCO to change the output frequency from the first frequency to the second frequency; and
    performing a zero phase restart (ZPR) operation to produce a phase detecting result according to the second frequency.

2. The frequency scaling method of claim 1, wherein the ADPLL includes a time-to-digitally converter (TDC) based ADPLL.

3. The frequency scaling method of claim 1, wherein the performing of the ZPR operation to produce the phase detecting result according to the second frequency comprises:
    performing the ZPR operation to produce the phase detecting result according to the second frequency and a frequency command word (FCW) with respect to the second frequency.

4. The frequency scaling method of claim 1, wherein the performing of the ZPR operation to produce the phase detecting result according to the second frequency comprises:
    performing the ZPR operation to produce the phase detecting result according to the second frequency for a specified time period.

5. The frequency scaling method of claim 4, further comprising:
    when the ZPR operation is performed for a specified time period, feeding the first OTW to the DCO and stopping the feeding of the second OTW to the DCO.

6. The frequency scaling method of claim 1, further comprising:
    obtaining the second OTW based on the first OTW and an OTW difference.

7. The frequency scaling method of claim 6, wherein the OTW difference is obtained based on a frequency difference between the first frequency and the second frequency.

8. An all-digital phase-locked loop (ADPLL), comprising:
a phase detecting circuit configured to detect a phase difference between an output frequency of a digitally controlled oscillator (DCO) and a reference frequency, and generating a phase detecting result based on the detected phase difference;
a DCO coupled to the phase detecting circuit, and the DCO being configured to generate the output frequency responsive to the phase detecting result; and
a frequency scaling circuit coupled to the phase detecting circuit and the DCO, and the frequency scaling circuit being configured to selectively feed a first oscillator tuning word (OTW) generated based on the phase detecting result or a second OTW to the DCO, so as to change the output frequency of the DCO from a first frequency to a second frequency.

9. The ADPLL of claim 8, wherein the phase detecting circuit comprises a zero phase restart (ZPR) circuit configured to perform a ZPR.

10. The ADPLL of claim 9, wherein the ZPR operation is performed responsive to a control of the frequency scaling circuit.

11. The ADPLL of claim 10, wherein when the frequency scaling circuit is requested to perform a frequency scaling operation, the frequency scaling circuit activates the ZPR operation for a specified time period.

12. The ADPLL of claim 9, wherein the phase detecting circuit further comprises:
a time-to-digital converter (TDC) configured to detect a phase difference between the reference frequency and the output frequency of the DCO;
a reference phase accumulator configured to accumulate a phase of a frequency command word (FCW); and
a variable phase accumulator configured to accumulate a phase of the output frequency of the DCO.

13. The ADPLL of claim 8, further comprising a loop filter coupled between the phase detecting circuit and the DCO.

14. The ADPLL of claim 13, further comprising a binary code to thermal code converter coupled between the loop filter and the DCO.

15. The ADPLL of claim 8, further comprising a lock detector coupled between the phase detecting circuit and the frequency scaling circuit.

16. The ADPLL of claim 8, wherein when the frequency scaling circuit is requested to perform a frequency scaling operation, and the frequency scaling circuit feeds the second OTW to the DCO.

17. The ADPLL of claim 8, wherein the frequency scaling circuit comprises an OTW injector, the OTW injector is configured to generate the second OTW based on the first OTW and an OTW difference, and the OTW difference is obtained based on a frequency difference between the first frequency and the second frequency.

18. A frequency scaling circuit for controlling a phase detecting circuit and a digitally controlled oscillator (DCO) in order to change an output frequency from a first frequency to a second frequency, comprising:
a control pulse generator configured to selectively feed a first oscillator tuning word (OTW) generated based on a phase detecting result by the phase detecting circuit or a second OTW to the DCO; and
an OTW injector configured to generate the second OTW.

19. The frequency scaling circuit of claim 18, wherein the control pulse generator further controls activation of a zero phase restart (ZPR) operation of the phase detecting circuit.

20. The frequency scaling circuit of claim 18, wherein the OTW injector generates the second OTW based on the first OTW and an OTW difference, and the OTW difference is obtained based on a frequency difference between the first frequency and the second frequency.

* * * * *